United States Patent
Wu

(10) Patent No.: US 6,410,403 B1
(45) Date of Patent: Jun. 25, 2002

(54) METHOD FOR PLANARIZING A SHALLOW TRENCH ISOLATION

(75) Inventor: Chao-Chueh Wu, Hsin-Chu (TW)

(73) Assignee: ProMos Technologies, Inc., Hsin-Chu (TW)

(*) Notice: Subject to any disclaimer, the term of this patent is extended or adjusted under 35 U.S.C. 154(b) by 0 days.

(21) Appl. No.: 09/703,831

(22) Filed: Nov. 2, 2000

(51) Int. Cl.[7] ............... H01L 21/8242; H01L 21/302; H01L 21/461; H01L 21/311
(52) U.S. Cl. .................. 438/424; 438/692; 438/697
(58) Field of Search .................. 438/424, 692, 438/697

(56) References Cited

U.S. PATENT DOCUMENTS

| | | | |
|---|---|---|---|
| 5,866,466 A | * | 2/1999 | Kim et al. |
| 6,015,757 A | | 1/2000 | Tsai et al. ............... 438/697 |
| 6,030,898 A | * | 2/2000 | Liu |
| 6,084,276 A | | 7/2000 | Gambino et al. ........... 257/397 |
| 6,090,714 A | | 7/2000 | Jang et al. ............... 438/692 |
| 6,143,635 A | * | 11/2000 | Boyd et al. |
| 6,187,650 B1 | * | 2/2001 | Wu et al. |
| 6,228,771 B1 | * | 5/2001 | Allers ................. 438/692 |
| 6,239,040 B1 | * | 5/2001 | Chen |

FOREIGN PATENT DOCUMENTS

| | | | | |
|---|---|---|---|---|
| JP | 359136943 A | * | 1/1983 | ........ 438/FOR 227 |
| JP | 361008943 A | * | 1/1986 | ........ 438/FOR 227 |

* cited by examiner

Primary Examiner—John F. Niebling
Assistant Examiner—Ron E. Pompey
(74) Attorney, Agent, or Firm—George O. Saile; Stephen B. Ackerman; William J. Stoffel

(57) ABSTRACT

A method of planarizing an isolation region. Key elements of the invention include the two chemical-mechanical polish (CMP) steps and the CMP stop structure comprised of a sacrificial oxide layer and the second nitride layer. First a pad oxide layer, a first nitride layer, a sacrificial oxide layer and a second nitride layer are formed over a substrate. A trench is formed through the pad oxide layer, the first nitride layer, the sacrificial oxide layer and the second nitride layer and in the substrate. An oxide layer is deposited filling the trench and over the second nitride layer. The oxide layer is preferably formed by a high density plasma chemical vapor deposition (HDPCVD) deposition. In a first CMP step, we chemical-mechanical polish the oxide layer and the second nitride layer down to a level. The second nitride layer and the sacrificial oxide layer are then removed. In the second CMP step, we chemical-mechanical polish the oxide layer and the first nitride layer so that the oxide layer is level with the first nitride layer. The invention reduces dishing effects.

11 Claims, 2 Drawing Sheets

METHOD FOR PLANARIZING A SHALLOW TRENCH ISOLATION

BACKGROUND OF INVENTION

1) Field of the Invention

This invention relates generally to fabrication of semiconductor devices and more particularly to the planarization of isolation layers and more particularly to the chemical-mechanical polishing (CMP) of oxide layer filling Shallow trench isolation trenches.

2) Description of the Prior Art

The advent of ULSI circuits has allowed if semiconductor manufactures worldwide to fabricated semiconductor devices to extremely compact dimensions. The formation of semiconductor devices involves the process of fabrication which provides isolation within the semiconductor device. In order to fabricated integrated circuits, devices isolated from one and another must first be formed in the silicon substrate. In fabrication of USLI, a small amount of leakage in a device can induce significant power dissipation for the overall circuit.

Trench isolation is used primarily for isolating devices in VLSI and ULSI and hence they can be considered as replacement for conventional LOCOS isolation. Shallow trench isolation has gained popularity for in compact semiconductor dimensions, such as quarter-micron technology and below. In a basic shallow trench isolation (STI) technology, shallow trenches are anisotropically etched into the silicon substrate. An oxide is deposited onto the substrate and is then planarized by chemical-mechanical polishing (CMP). Another approach is called a buried oxide with etch stop processes (BOXES). The process uses a silicon nitride etch-stop layer and a pad layer formed on the TV substrate before the oxide is deposited.

Problems associated with the formation of the STI include dishing effect of wide trenches, erosion of small nitride areas, and oxide remaining on the large nitride areas.

Shallow trench isolation (STI) chemical-mechanical polish (CMP) is important especially in DRAM, due the Array VT is very sensitive to STI leveling. The STI oxide level uniformity is influenced by chemical-mechanical polish (CMP).

The importance of overcoming the various deficiencies noted above is evidenced by the extensive technological development directed to the subject, as documented by the relevant patent and technical literature. The closest and apparently more relevant technical developments in the patent literature can be gleaned by considering U.S. Pat. No. 6,015,757 (Tsai et al.) that discloses a three layer shallow trench isolation (STI) chemical-mechanical polish (CMP) structure (including polysilicon) and CMP method. However, this method can be further improved upon.

U.S. Pat. No. 6,090,714 (Jang et al.) shows a two layer STI CMP structure and CMP method.

U.S. Pat. No. 6,084,276 (Gambino et al.) shows a two layer STI CMP structure and CMP method.

SUMMARY OF THE INVENTION

It is an object of the present invention to provide a method for planarizing an isolation layer formed in a trench.

It is an object of the present invention to provide a method for planarizing an isolation layer formed in a trench using a two step CMP and a pad oxide layer, the first nitride layer, the sacrificial oxide layer and the second nitride layer CMP stop structure.

It is an object of the present invention to provide a method for planarizing an high density plasma chemical vapor deposition (HDPCVD) oxide isolation layer formed in a trench using a two step CMP and a CMP stop structure comprised of a pad oxide layer, a first nitride layer, a sacrificial oxide layer and a second nitride layer.

The invention provides a method of planarizing an isolation region. Important elements of the invention are two CMP steps and the CMP stop structure comprised of a sacrificial oxide layer and a second nitride layer. The method begins when a pad layer, a first nitride layer, a sacrificial oxide layer and a second nitride layer are formed over a substrate. A trench is formed through the pad layer, the first nitride layer, the sacrificial oxide layer, the second nitride layer and in the substrate. An isolation oxide layer is deposited filling the trench and over the second nitride layer. The oxide layer is preferably formed by a high density plasma chemical vapor deposition (HDPCVD) deposition. In a first CMP step, the oxide layer and the second nitride layer are chemical-mechanical polished down to a desired level. The second nitride layer and the sacrificial oxide layer are then removed. In a second CMP step, we chemical-mechanical polish the oxide layer and the first nitride layer so that the oxide layer is about level with the first nitride layer. Lastly, the first nitride layer and the pad layer are removed and devices are formed in the active areas.

Key elements of the invention are the two CMP steps and the CMP stop structure comprised of a sacrificial oxide layer and a second nitride layer. The second nitride layer and the sacrificial oxide layer allow the STI oxide layer to be substantially planarized by the first CMP step. Then, after the remaining second nitride layer and the sacrificial oxide layer are removed, the second CMP step planarizes the oxide to the final thickness. The thickness of pad layer and the first nitride layer determine the end thickness of the STI oxide (isolation oxide) above the substrate surface. The invention's two CMP steps substantially reduce dishing of the STI oxide in wide STI areas. The invention is especially suited to planarize STI oxide formed by HDPCVD process (simultaneous deposition and sputtering).

Additional objects and advantages of the invention will be set forth in the description that follows, and in part will be obvious from the description, or may be learned by practice of the invention. The objects and advantages of the invention may be realized and obtained by means of instrumentalities and combinations particularly pointed out in the append claims.

BRIEF DESCRIPTION OF THE DRAWINGS

The features and advantages of a semiconductor device according to the present invention and further details of a process of fabricating such a semiconductor device in accordance with the present invention will be more clearly understood from the following description taken in conjunction with the accompanying drawings in which like reference numerals designate similar or corresponding elements, regions and portions and in which.

DETAILED DESCRIPTION OF THE PREFERRED EMBODIMENTS

The present invention will be described in detail with reference to the accompanying drawings.

Figure 1:
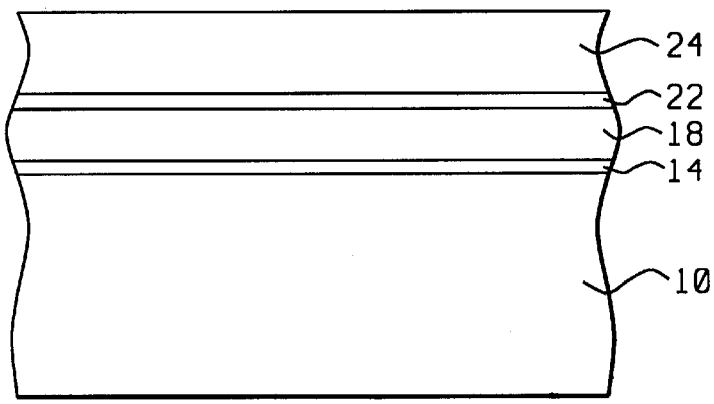
FIGS. 1 through 6 are cross sectional views for illustrating a preferred embodiment of the STI planarization method according to the present invention.

As shown in FIG. 1, we sequentially form a pad oxide layer 14, a first nitride layer 18, a sacrificial oxide layer 22 and a second nitride layer 24 over a substrate 10.

Within the present invention, the substrate 10 may be a substrate employed within a microelectronics fabrication selected from the group including but not limited to integrated circuit microelectronics fabrications, solar cell microelectronics fabrications, ceramic substrate microelectronics fabrications and flat panel display microelectronics fabrications. Although not specifically illustrated within the schematic cross-sectional diagram of FIG. 1, the substrate 10 may be the substrate itself employed within the microelectronics fabrication, or in the alternative, the substrate may be the substrate employed within tile microelectronics fabrication, where the substrate has formed thereupon or thereover any of several additional microelectronics layers as are conventionally employed within the microelectronics fabrication, Such additional microelectronics layers may include, but are not limited to, microelectronics conductor layers, microelectronics semiconductor layers and microelectronics dielectric layers. The substrate is preferably a doped silicon wafer.

The pad layer 14 (e.g., pad oxide layer) is preferably comprised of oxide and preferably has a thickness of between about 40 and 80 Å.

The first nitride layer 18 preferably has a thickness of between about 600 and 1000 Å.

The sacrificial oxide layer 22 preferably has a thickness of between about 100 and 200 Å. The sacrificial oxide layer 22 is preferably formed by a CVD process and is most preferably formed by a PECVD or APCVD process.

The second nitride layer preferably has a thickness of between about 200 and 1500 Å depending on the SiN loss of pre-layers. For instance, the thickness of second nitride layer is smaller in deep trench process.

Figure 2:
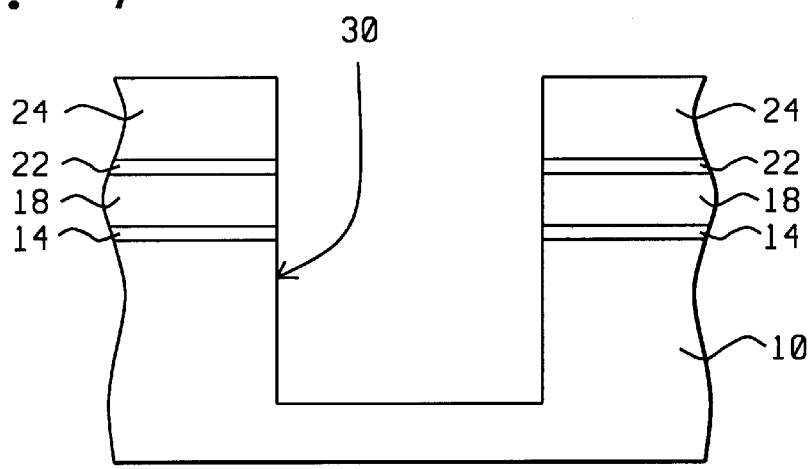

Referring to FIG. 2, we form a trench 30 through the pad oxide layer 14, the first nitride layer 18, the sacrificial oxide layer 22 and the second nitride layer 24 and in the substrate 10. The trench 30 preferably has a depth in the substrate between 2500 and 3000 Å.

The areas were the trench is formed are isolation areas. The non-trench areas are active areas (AA) where devices are later formed.

Figure 3:
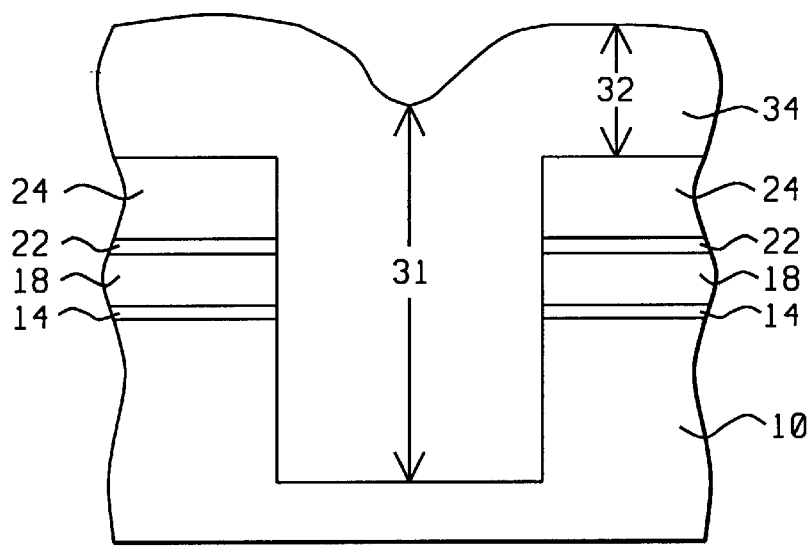

As shown in FIG. 3, we deposit an isolation oxide layer 34 (e.g., STI oxide) filling the trench 30 and over the second nitride layer 24.

The oxide layer is preferably formed by an HDPCVD deposition.

The oxide layer preferably has a thickness 31 in the trench of between about 4500 and 5000 Å.

The oxide layer preferably has a thickness 32 over the second nitride layer between 1500 and 2500 Å.

Figure 4:
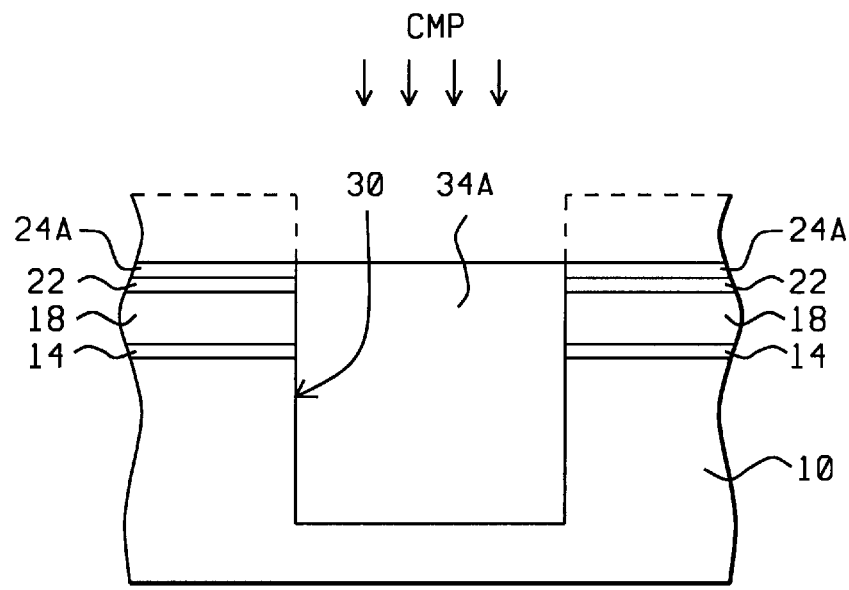

As shown in FIG. 4, we chemical-mechanical polish the oxide layer 34A and the second nitride layer 24A down to a level so that the second nitride layer 24A has a thickness of between about 50 and 200 Å.

The oxide layer preferably has a thickness in the trench of between about 2500 and 3000 Å.

Figure 5:
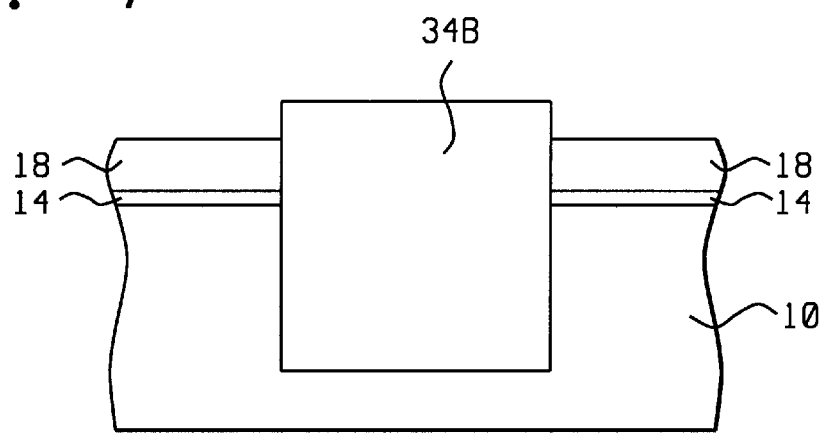

As shown in FIG. 5, we remove the second nitride layer and the sacrificial oxide layer and a thickness of the oxide layer 34B. The second nitride layer is removed by H3PO4 because it has high selectivity to nitride, and the sacrificial oxide layer is removed by diluted HF.

Figure 6:
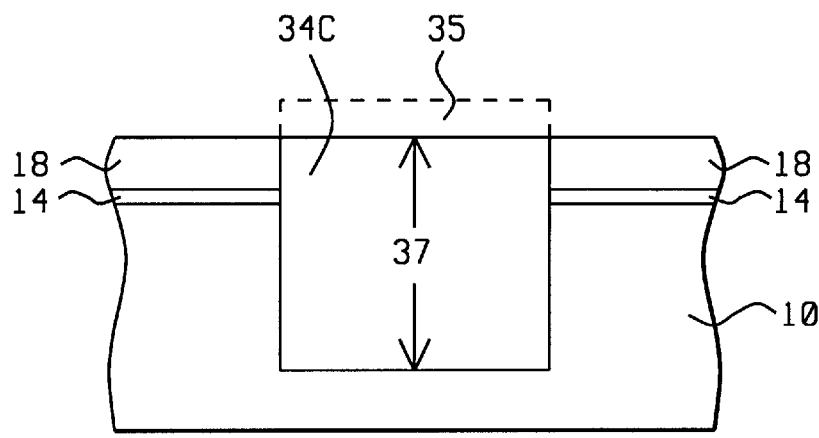

As shown in FIG. 6, we chemical-mechanical polish the oxide layer and the first nitride layer 18 so that the top surface of the oxide layer is about level (within +/−20% and more preferably 10% of the thickness of first nitride layer) with it the top surface of the first nitride layer 18 and it can obtain a good uniformity on the surface of oxide layer within the wafer.

An important feature of the invention is that the combined thickness of the first nitride layer and the pad layer, is the planned thickness of the oxide 34C that is above the substrate surface and the uniformity of STI oxide layer is close to the first nitride layer.

Next, the first nitride layer 18 and the pad layer are removed preferably uses a selective etch.

Subsequently, devices are formed in the non-STI areas. For example FET devices can be formed in and on the substrate surface.

Key elements of the invention are the two CMP steps and the CMP stop structure comprised of a sacrificial oxide layer and the second nitride layer. The second nitride layer and the sacrificial oxide layer allow the STI oxide layer to be substantially planarized by the first CMP step. Then, after the remaining second nitride layer and the sacrificial oxide layer are removed, the second CMP step planarizes the oxide to the final thickness. The thickness of pad layer and the first nitride layer determine the end thickness of the STI oxide (isolation oxide) above the substrate surface. The invention's two CMP steps substantially reduce dishing of the STI oxide in wide STI areas. The invention is especially suited to planarize STI oxide formed by HDPCVD process (simultaneous deposition and sputtering).

It should be recognized that many publications describe the details of common techniques used in the fabrication process of integrated circuit components. Those techniques can be generally employed in the fabrication of the structure of the present invention. Moreover, the individual steps of such a process can be performed using commercially available integrated circuit fabrication machines. As specifically necessary to an understanding of the present invention, exemplary technical data are set forth based upon current technology. Future developments in the art may call for appropriate adjustments as would be obvious to one skilled in the art.

As a preface to the detailed description, it should be noted that, as used in this specification and the appended claims, the singular forms "a", "an", and "the" include plural referents, unless the context clearly dictates otherwise. Thus, for example, the term "a semiconductor" includes a variety of different materials which are known to have the behavioral characteristics of a semiconductor.

In the above description numerous specific details are set forth such as flow rates, pressure settings, thicknesses, etc., in order to provide a more thorough understanding of the present invention. It will be obvious, however, to one skilled in the art that the present invention may be practiced without these details. In other instances, well known process have not been described in detail in order to not unnecessarily obscure the present invention. Also, the flow rates in the specification can be scaled up or down keeping the same molar % or ratios to accommodate difference sized reactors as is known to those skilled in the art.

While the invention has been particularly shown and described with reference to the preferred embodiments thereof, it will be understood by those skilled in the art that various changes in form and details may be made without departing from the spirit and scope of the invention. It is intended to cover various modifications and similar arrangements and procedures, and the scope of the appended claims therefore should be accorded the broadest interpretation so as to encompass all such modifications and similar arrangements and procedures.

What is claimed is:

1. A method of planarizing an isolation region; comprising the steps of:

a) forming a pad oxide layer, a first nitride layer, a sacrificial oxide layer and a second nitride layer over a substrate;

b) forming a trench through said pad oxide layer, said first nitride layer, said sacrificial oxide layer and said second nitride layer and in said substrate;

c) depositing an oxide layer filling said trench and over said second nitride layer;

d) chemical-mechanical polishing said oxide layer and said second nitride layer down to a level so that said second nitride layer has a thickness of between about 50 and 200 Å;

e) removing said second nitride layer and said sacrificial oxide layer and a thickness of said oxide layer;

f) chemical-mechanical polishing said oxide layer and said first nitride layer so that the top surface of said oxide layer is about level within 10 percent, with the top surface of said first nitride layer.

2. The method of claim 1 wherein step (a) further includes said pad oxide layer has a thickness of between about 40 and 80 Å.

3. The method of claim 1 wherein step (a) further includes said first nitride layer has a thickness of between about 600 and 1000 Å.

4. The method of claim 1 wherein step (a) further includes said sacrificial oxide layer 22 has a thickness of between about 100 and 200 Å.

5. The method of claim 1 wherein step (a) further includes said second nitride layer has a thickness of between about 200 and 1500 Å.

6. The method of claim 1 wherein said trench has a depth in said substrate between about 2500 and 3000 Å.

7. The method of claim 1 wherein said oxide layer formed by a high density plasma chemical vapor deposition (HDPCVD) deposition.

8. The method of claim 1 wherein step (c) further includes said oxide layer having a thickness in said trench of between about 4500 and 5000 Å.

9. The method of claim 1 wherein step (c) further includes said oxide layer having a thickness over said second nitride layer between 1500 and 2500 Å.

10. A method of planarizing an isolation region; comprising the steps of:

a) forming a pad oxide layer, a first nitride layer, a sacrificial oxide layer and a second nitride layer over a substrate;
(1) said pad oxide layer has a thickness of between about 40 and 80 Å;
(2) said first nitride layer has a thickness of between about 600 and 1000 Å;
(3) said sacrificial oxide layer has a thickness of between about 100 and 200 Å;
(4) said second nitride layer has a thickness of between about 200 and 1500 Å;

b) forming a trench through said pad oxide layer, said first nitride layer, said sacrificial oxide layer and said second nitride layer and in said substrate;
(1) said trench has a depth in said substrate between 2500 and 3000 Å;

c) depositing an oxide layer filling said trench and over said second nitride layer;
(1) said oxide layer formed by a high density plasma chemical vapor deposition process deposition;
(2) said oxide layer having a thickness in said trench of between about 4500 and 5000 Å;
(3) said oxide layer having a thickness over said second nitride layer between 1500 and 2500 Å;

d) chemical-mechanical polishing said oxide layer and said second nitride layer down to a level so that said second nitride layer has a thickness of between about 50 and 200 Å;

e) removing said second nitride layer and said sacrificial oxide layer and a thickness of said oxide layer; and f) chemical-mechanical polishing said oxide layer and said first nitride layer so that said oxide layer is level with said first nitride layer.

11. A method of planarizing an isolation region; comprising the steps of:

a) forming a pad oxide layer, a first nitride layer, a sacrificial oxide layer and a second nitride layer over a substrate;

b) forming a trench through said pad oxide layer, said first nitride layer, said sacrificial oxide layer and said second nitride layer and in said substrate;

c) depositing an oxide layer filling said trench and over said second nitride layer;

d) chemical-mechanical polishing said oxide layer and said second nitride layer down to a level; removing said second nitride layer and said sacrificial oxide layer and a portion of said oxide layer; and e) chemical-mechanical polishing said oxide layer and said first nitride layer so that the top surface of said oxide layer is about level with the top surface of said first nitride layer within 20 percent of the thickness of said first nitride layer.

* * * * *